(12) United States Patent
Arimura et al.

(10) Patent No.: US 9,418,812 B2
(45) Date of Patent: Aug. 16, 2016

(54) ELECTRIC FUSE

(71) Applicant: SOCIONEXT INC., Yokohama-shi, Kanagawa (JP)

(72) Inventors: Kazuyoshi Arimura, Kasugai (JP); Akihiko Ono, Nagoya (JP); Masashi Ishida, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 314 days.

(21) Appl. No.: 13/741,188

(22) Filed: Jan. 14, 2013

(65) Prior Publication Data

US 2013/0189882 A1    Jul. 25, 2013

(30) Foreign Application Priority Data

Jan. 20, 2012  (JP) ................. 2012-010345

(51) Int. Cl.
*H01H 85/055*    (2006.01)
*H01H 85/00*    (2006.01)
*H01L 23/525*    (2006.01)
*H01H 85/46*    (2006.01)

(52) U.S. Cl.
CPC ......... *H01H 85/055* (2013.01); *H01H 85/0039* (2013.01); *H01L 23/5256* (2013.01); *H01H 85/46* (2013.01); *H01L 23/5258* (2013.01); *H01L 2924/0002* (2013.01)

(58) Field of Classification Search
CPC  H01L 23/5256; H01L 23/5258; H01H 85/12; H01H 85/055; H01H 85/0039; H01H 85/0073; H01H 85/46
USPC ........................................... 337/14; 257/529
See application file for complete search history.

(56) References Cited

U.S. PATENT DOCUMENTS

| | | | |
|---|---|---|---|
| 6,878,614 B2 | 4/2005 | Sun et al. | |
| 2005/0077594 A1* | 4/2005 | Matsunaga | ......... H01L 23/5256 257/529 |
| 2005/0230782 A1* | 10/2005 | Takewaki et al. | .............. 257/529 |

(Continued)

FOREIGN PATENT DOCUMENTS

| | | |
|---|---|---|
| JP | 2007-073576 A | 3/2007 |
| JP | 2007-311372 A | 11/2007 |
| KR | 10-2011-0002980 A | 1/2011 |

OTHER PUBLICATIONS

Korean Office Action, Korean Patent Application No. 10-2013-0004907 dated Jan. 27, 2014.

(Continued)

*Primary Examiner* — Anatoly Vortman
*Assistant Examiner* — Jacob Crum
(74) *Attorney, Agent, or Firm* — Arent Fox LLP

(57) ABSTRACT

An electric fuse includes a conductive material formed on a top surface of an insulating material. The conductive material includes a wiring portion, and first and second terminal portions arranged in two ends of the wiring portion so that the wiring portion is located between the first and second terminal portions. The first terminal portion, the wiring portion, and the second terminal portion are lined up in a first direction. The first and second terminal portions each have a width larger than a width of the wiring portion in a second direction perpendicular to the first direction. The electric fuse includes a film including an opening which exposes a region between the first terminal portion and the second terminal portion. The film is formed above at least a part of the wiring portion and has a tensile stress.

15 Claims, 4 Drawing Sheets

(56) References Cited

U.S. PATENT DOCUMENTS

| | | | |
|---|---|---|---|
| 2008/0061378 A1* | 3/2008 | Kuroyanagi et al. | 257/379 |
| 2008/0093703 A1* | 4/2008 | Yang et al. | 257/529 |
| 2009/0001506 A1 | 1/2009 | Kim et al. | |
| 2009/0243033 A1* | 10/2009 | Lee | 257/529 |
| 2010/0224956 A1* | 9/2010 | Kim et al. | 257/529 |
| 2011/0001210 A1 | 1/2011 | Jeon | |

OTHER PUBLICATIONS

Chinese Office Action issued Feb. 4, 2015; Chinese Application No. 201310015496.5, with English Translation.

Japanese Office Action, Japanese Patent Application No. 2012-010345 dated Sep. 8, 2015.

* cited by examiner

ELECTRIC FUSE

CROSS-REFERENCE TO RELATED APPLICATIONS

This application is based upon and claims the benefit of priority from prior Japanese Patent Application No. 2012-010345, filed on Jan. 20, 2012, the entire contents of which are incorporated herein by reference.

FIELD

This disclosure relates to an electric fuse which is electrically disconnected.

BACKGROUND

Conventionally, a semiconductor device includes a fuse circuit having electric fuses in order to set a redundancy circuit or adjust resistance values (see Japanese Laid-Open Patent Publication No. 2007-073576). The electric fuses are molten and broken due to supply of an overcurrent. The fuse circuit generates a signal that corresponds to the state of an electric fuse (unbroken state or conduction state having a low resistance value, or broken state or non-conduction state having a high resistance value).

In the electric fuse, it is difficult to sufficiently secure the insulating distance between ends of a molten portion, that is, distance between fuse conductors which are molten and separated from each other. If the insulating distance of the molten portion is not sufficient, there is a possibility that so-called glow-back may occur by which the value of resistance between two terminals of the electric fuse gradually decreases over time owing to, e.g., electromigration. This may change the molten portion of the electric fuse to the conduction state.

SUMMARY

According to one aspect, an electric fuse includes a conductive material formed on a top surface of an insulating material. The conductive material includes a wiring portion, and first and second terminal portions arranged in two ends of the wiring portion so that the wiring portion is located between the first and second terminal portions. The first terminal portion, the wiring portion, and the second terminal portion are lined up in a first direction. The first and second terminal portions each have a width larger than a width of the wiring portion in a second direction perpendicular to the first direction. The electric fuse includes a film including an opening which exposes a region between the first terminal portion and the second terminal portion. The film is formed above at least a part of the wiring portion and has a tensile stress.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which.

DESCRIPTION OF THE EMBODIMENTS

One embodiment will now be described below with reference to the accompanying drawings. The accompanying drawings are given to outline structures and not realistic in size.

Figure 1A:
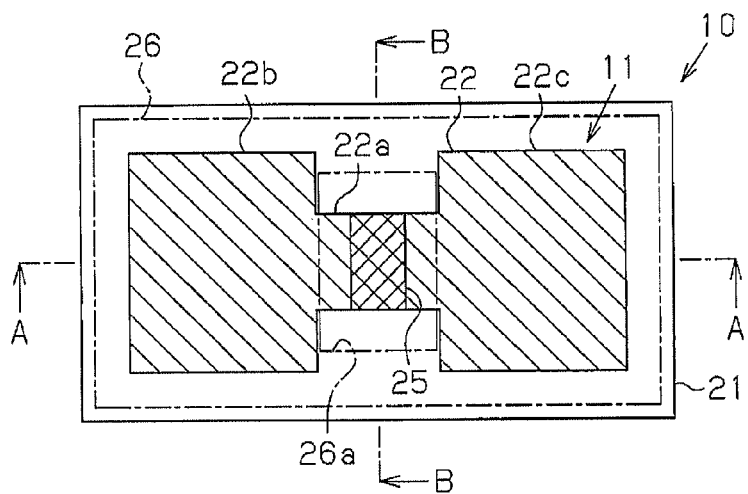
FIG. 1A is a plan view schematically illustrating an electric fuse.

As illustrated in FIG. 1A, a semiconductor device 10 includes an electric fuse 11. In general, the electric fuse 11 includes a conductive material 22 and a cover film 25 formed above the conductive material 22. The conductive material 22 may be, for example, a polycrystalline silicon film. The cover film 25 may be, for example, a silicon nitride film. As the silicon nitride film, SiN or $Si_3N_4$ may be used, for example.

Figure 1B:
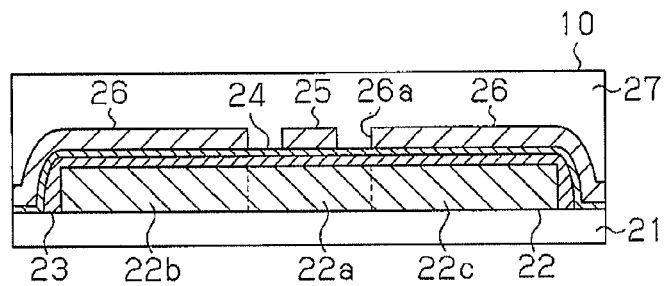
FIG. 1B is a schematic cross-sectional view taken along line A-A of FIG. 1A.
Figure 1C:
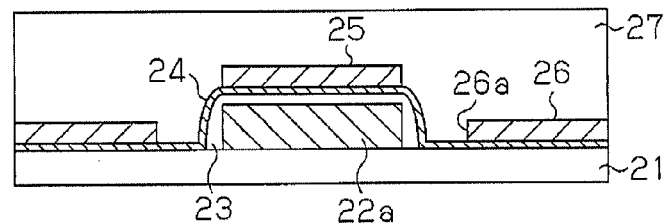
FIG. 1C is a schematic cross-sectional view taken along line B-B of FIG. 1A.

FIG. 1B illustrates a schematic cross-sectional view taken along line A-A of FIG. 1A. FIG. 1C illustrates a schematic cross-sectional view taken along line B-B of FIG. 1A. As illustrated in FIGS. 1B and 1C, the semiconductor device 10 includes an insulating material 21. The insulating material 21 may be, for example, an interlayer insulating film formed between wiring layers, which is formed by local oxidation of silicon (LOCOS) or shallow trench isolation (STI). The conductive material 22 is formed on a top surface of the insulating material 21.

As illustrated in FIG. 1A, the conductive material 22 includes a wiring portion 22a, a first terminal portion 22b, and a second terminal portion 22c. The wiring portion 22a extends in a given direction (right and left direction in FIG. 1A) and is formed rectangular when viewed from above. The first terminal portion 22b is coupled to one end of the wiring portion 22a and the second terminal portion 22c is coupled to the other end of the wiring portion 22a. That is, the first and second terminal portions 22b and 22c are arranged in the two ends of the wiring portion 22a so that the wiring portion 22a is located between the first and second terminal portions 22b and 22c. In the following, to facilitate understanding, a direction (right and left direction in FIG. 1A) in which the first terminal portion 22b, the wiring portion 22a, and the second terminal portion 22c are arranged is referred to as a first direction. Further, a direction (up and down direction in FIG. 1A) perpendicular to the first direction is referred to as a second direction. The first and second terminal portions 22b and 22c are each formed rectangular when viewed from above. The first and second terminal portions 22b and 22c each have a width larger than a width of the wiring portion 22a in the second direction. In the electric fuse 11 including the wiring portion 22a and the terminal portions 22b and 22c, when a voltage for disconnection is supplied to the conductive material 22, heat is generated intensively at the wiring portion 22a.

A plurality of wirings is coupled to each of the terminal portions 22b and 22c. These wirings may be made of, for example, tungsten (W). The wirings coupled to the terminal portions 22b and 22c are coupled to wirings formed on an interlayer insulating film 27.

As illustrated in FIGS. 1B and 1C, an insulating film 23 is formed in a manner that covers a top surface and side surfaces of the conductive material 22. The insulating film 23 may be, for example, a silicon oxide film ($SiO_2$).

An insulating film 24 is formed on the insulating film 23. The insulating film 24 covers the top surface of the insulating material 21. The insulating film 24 may be, for example, a silicon oxide film ($SiO_2$).

A cover film 25 is formed on the insulating film 24. The cover film 25 is arranged above the wiring portion 22a. In the present embodiment, the cover film 25 covers a portion of the wiring portion 22a. For example, as illustrated in FIG. 1A, the cover film 25 covers the midsection of the wiring portion 22a. The cover film 25 may be, for example, a silicon nitride film. As the silicon nitride film, SiN or $Si_3N_4$ may be used, for example. The silicon nitride film has a characteristic of high tensile stress as compared to the silicon oxide film. The tensile stress that occurs on the cover film 25 is applied to the wiring portion 22a in a direction toward the insulating material 21. That is, the tensile stress occurring on the cover film 25 acts as force (pressing force) that presses the wiring portion 22a toward the insulating material 21.

Figure 1D:
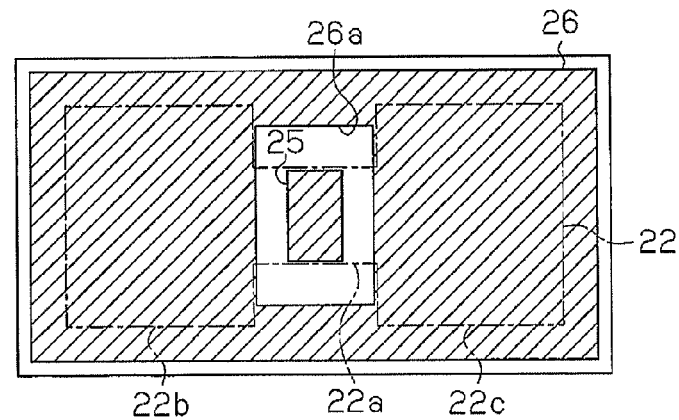
FIG. 1D is a plan view schematically illustrating elements such as a cover film and a protection film of the electric fuse of FIG. 1A.

As illustrated in FIG. 1B, a protection film 26 is formed above the terminal portions 22b and 22c. The protection film 26 may be, for example, a silicon nitride film. As the silicon nitride film, for example, SiN or $Si_3N_4$ may be used. For example, the cover film 25 and the protection film 26 may be a silicon nitride film made of the same material. In other words, the cover film 25 may be referred to as a portion of the protection film 26. As illustrated in FIG. 1D, the protection film 26 has an opening 26a which exposes a region between the first terminal portion 22b and the second terminal portion 22c. The shape and size of the opening 26a illustrated in FIG. 1D are merely one example and may be in any other shape and size. In the present embodiment, the opening 26a has a size corresponding to a rectangular region including the wiring portion 22a. For example, the opening 26a is formed to expose the wiring portion 22a as well as side regions adjacent to the both sides of the wiring portion 22a (regions between the terminal portions 22b and 22c extending along the wiring portion 22a in the first direction). In the present embodiment, the cover film 25 is formed within the opening 26a.

In FIG. 1D, to facilitate understanding of the positional relationships of the cover film 25 and protection film 26 with respect to the conductive material 22, the conductive material 22 is illustrated by a dashed line. Further, to facilitate understanding of the positional relationships of the cover film 25 and protection film 26 with respect to the wiring portion 22a, their respective end portions are shifted from each other.

An interlayer insulating film 27 is formed on the protection film 26. The interlayer insulating film 27 covers the insulating film 24, the cover film 25, and the protection film 26. The interlayer insulating film 27 has a top surface that is flattened by, for example, chemical mechanical polishing (CMP) in order to form an upper wiring layer (not illustrated).

Figure 2:
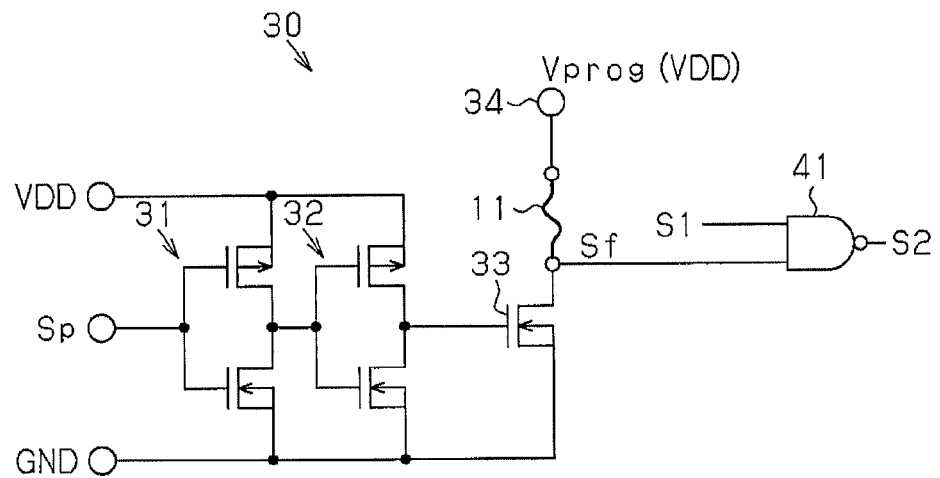
FIG. 2 is a circuit diagram schematically illustrating one example of a fuse circuit.

The electric fuse 11 formed as above is used in, for example, a fuse circuit 30 illustrated in FIG. 2. The fuse circuit 30 includes the electric fuse 11, a buffer circuit 31, a pre-driver 32, and a disconnecting driver 33.

The electric fuse 11 has a first terminal coupled to a terminal 34 and a second terminal coupled to the disconnecting driver 33. In normal operation (when the semiconductor device 10 is in ordinary use), the terminal 34 is supplied with a drive voltage. When programming (disconnecting) the electric fuse 11, the terminal 34 is supplied with a disconnecting voltage for disconnection of the electric fuse 11. The disconnecting driver 33 is, for example, an N-channel MOS transistor. The disconnecting driver 33 includes a first terminal (source terminal), a second terminal (drain terminal), and a control terminal (gate terminal). The first terminal of the disconnecting driver 33 is coupled to the wiring having a ground (GND) potential. The second terminal of the disconnecting driver 33 is coupled to the second terminal of the electric fuse 11. The control terminal of the disconnecting driver 33 is supplied with a signal that is in accordance with a program signal Sp via the buffer circuit 31 and the pre-driver 32. Each of the buffer circuit 31 and the pre-driver 32 may be an inverter circuit that includes, for example, a P-channel MOS transistor and an N-channel MOS transistor.

The disconnecting driver 33 is activated by the program signal Sp of an H level and deactivated by the program signal Sp of an L level.

The second terminal of the electric fuse 11 is coupled to a first input terminal of a logic circuit (for example, NAND gate 41 in FIG. 2). A second input terminal of the NAND gate 41 is supplied with a signal S1. The NAND gate 41 generates a signal S2 that is in accordance with the signals Sf and S1.

When the electric fuse 11 is not disconnected, that is, when the electric fuse 11 is in an unbroken state, the value of resistance between the first and second terminals of the electric fuse 11 corresponds to the resistance value of the wiring portion 22a illustrated in FIG. 1. In this case, the NAND gate 41 is supplied with the signal Sf having an H level that corresponds to the drive voltage. Therefore, in response to the H level signal Sf, the NAND gate 41 generates the signal S2 having a logically inverted level of the signal S1.

When the electric fuse 11 is disconnected, that is, when the electric fuse 11 is in a broken state, the value of resistance between the first and second terminals of the electric fuse 11 becomes high due to meltdown of the electric fuse 11. In this case, the NAND gate 41 is supplied with the signal Sf having the ground (GND) level, that is, an L level. Therefore, the NAND gate 41 generates the signal S2 having an H level in response to the L level signal Sf.

The operation of the electric fuse 11 will now be described.

In the fuse circuit 30 illustrated in FIG. 2, the terminal 34 is supplied with a disconnection voltage Vprog, and the buffer circuit 31 is supplied with the program signal Sp of the H level. Thus, the disconnecting driver 33 is activated by the H level program signal Sp. Then, a current to disconnect or break the electric fuse 11 flows via the electric fuse 11 and the disconnecting driver 33 from the terminal 34.

Figure 3A:
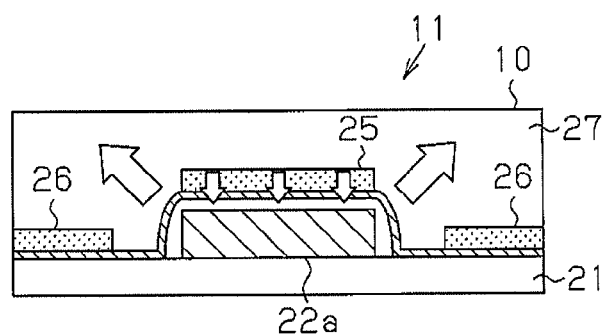
FIG. 3A is a cross-sectional view schematically illustrating the operation of the electric fuse of FIG. 1A.
Figure 3B:
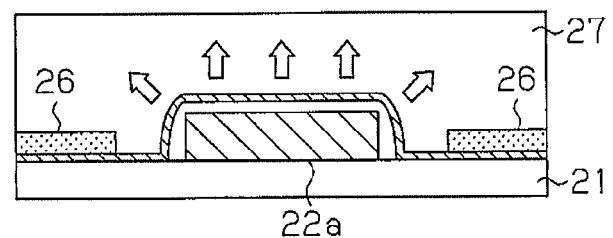
FIG. 3B is a cross-sectional view schematically illustrating the operation of an electric fuse of a comparison example.

FIG. 3A is a cross-sectional view schematically illustrating the operation of the electric fuse 11 of the present embodiment, and FIG. 3B is a cross-sectional view schematically illustrating the operation of an electric fuse of a comparison example. To facilitate understanding, the electric fuse of the comparison example is given the same symbols as those of the electric fuse 11 of the present embodiment. The wiring portion 22a illustrated in FIGS. 3A and 3B is heated and melts by a current flowing through the wiring portion 22a. In this case, since no cover film is formed in the electric fuse of the comparison example illustrated in FIG. 3B, the wiring portion 22a formed on the insulating material 21 expands upward.

In contrast, as illustrated in FIG. 3A, in the electric fuse 11 of the present embodiment, the cover film 25 formed above the wiring portion 22a suppresses the wiring portion 22a, which is molten, from expanding. As a result, the molten wiring portion 22a expands in a direction (obliquely upward in FIG. 3A) in which the cover film 25 is not formed. Further, in FIG. 1, the molten wiring portion 22a expands not only in the direction in which the cover film 25 is not formed (that is, the obliquely upward direction illustrated in FIG. 3A) but also along the top surface of the insulating material 21. As a result, the wiring portion 22a is disconnected, or broken. That is, in comparison to the electric fuse in FIG. 3B where the cover film 25 is not formed, in the electric fuse 11 in FIG. 3A where the cover film 25 is formed, the wiring portion 22a, which is molten, moves to a wide range in a direction away from the disconnected portion. Accordingly, when the wiring portion 22a is crystallized, the distance between ends of the disconnected portion and that between fragmented conductors become larger than a case where the cover film 25 is not formed. Therefore, glow-back hardly occurs between the ends of the disconnected portion and the fragmented conductors.

Figure 4A:
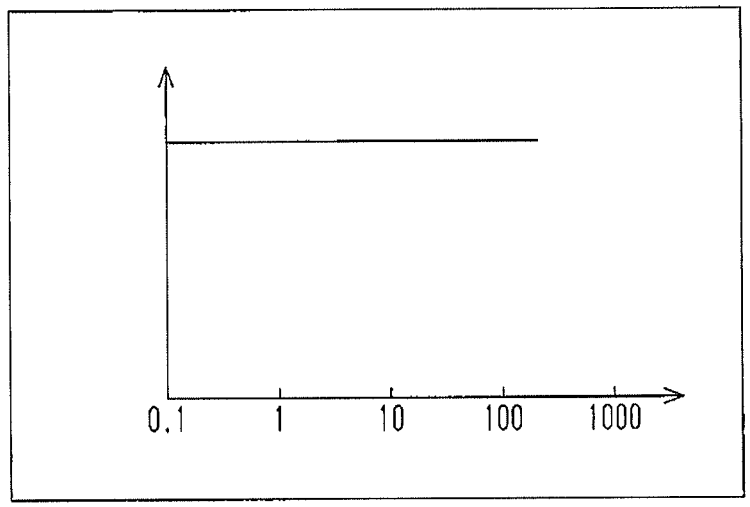
FIG. 4A is a graph illustrating characteristics of the electric fuse of FIG. 1A.
Figure 4B:
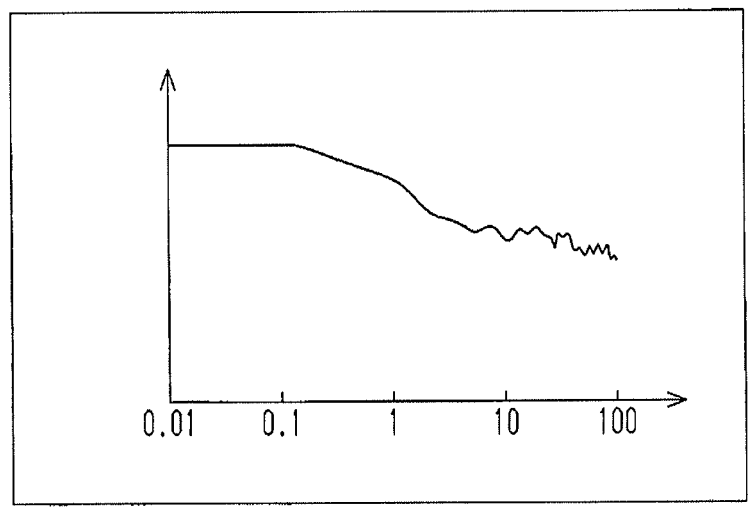
FIG. 4B is a graph illustrating characteristics of the electric fuse of the comparison example.

FIG. 4A illustrates time-related variations in characteristics of the electric fuse 11 illustrated in FIG. 3A, and FIG. 4B illustrates time-related variations in characteristics of the electric fuse illustrated in FIG. 3B. In FIGS. 4A and 4B, the horizontal axis indicates a lapse of time and the vertical axis indicates a voltage (for example, voltage of the output signal Sf of the fuse circuit 30 illustrated in FIG. 2). As illustrated in FIG. 4A, in the electric fuse 11 of the present embodiment illustrated in FIG. 3A, almost no time-related variations in voltage are observed that depend on the resistance value of the electric fuse 11. In contrast, as illustrated in FIG. 4B, in the electric fuse of the comparison example illustrated in FIG. 3B, time-related variations in voltage are observed that depend on the resistance value of the electric fuse. The same disconnection conditions (for example, voltage and time applied for disconnection) are employed both in the cases of the electric fuse 11 of the present embodiment and the electric fuse of the comparison example.

In some cases, the electric fuse of the comparison example illustrated in FIG. 3B is not disconnected or encounters a failure of the disconnection even when it is supplied with the applied voltage. This may be because the wiring portion 22a molten by the applied voltage expands upward above the insulating material 21 as described above and, therefore, the molten wiring portion 22a is connected again as a result of crystallization.

In contrast, the electric fuse 11 of the present embodiment hardly encounters the failure of the disconnection. This is because in the electric fuse 11 of the present embodiment, the molten wiring portion 22a expands to a wide range away from the disconnected portion as compared to that of the comparison example. Accordingly, even when the wiring portion 22a is crystallized, the wiring portion 22a is fragmented and, therefore, the molten wiring portion 22a is hardly connected again.

The electric fuse 11 of the present embodiment has the following advantages.

The conductive material 22 is formed on the top surface of the insulating material 21 of the semiconductor device 10. The conductive material 22 includes the wiring portion 22a, which extends in the given direction (first direction), and the terminal portions 22b and 22c, which are arranged on the both ends of the wiring portion 22a and have a larger width than that of the wiring portion 22a in the second direction perpendicular to the first direction. The cover film 25 which partially covers the wiring portion 22a is formed above the wiring portion 22a. The cover film 25 has high tensile stress.

The cover film 25 formed above the wiring portion 22a suppresses the wiring portion 22a, which is molten, from expanding. Therefore, the molten wiring portion 22a expands in the direction in which the cover film 25 is not formed. As a result, the wiring portion 22a is disconnected, or broken. In this case, the molten wiring portion 22a moves to a wide range away from the disconnected portion as compared to a case where the cover film 25 is not formed. Therefore, when the wiring portion 22a is crystallized, the distance between the ends of the disconnected portion and that between the fragmented conductors become larger than a case where the cover film 25 is not formed. Accordingly, the cover film 25 may suppress glow-back from occurring between the ends of the disconnected portion and between the fragmented conductors.

It should be apparent to those skilled in the art that the aforementioned embodiments may be embodied in many other forms without departing from the scope of the invention. Particularly, it should be understood that the aforementioned embodiments may be embodied in the following forms.

Figure 5A:
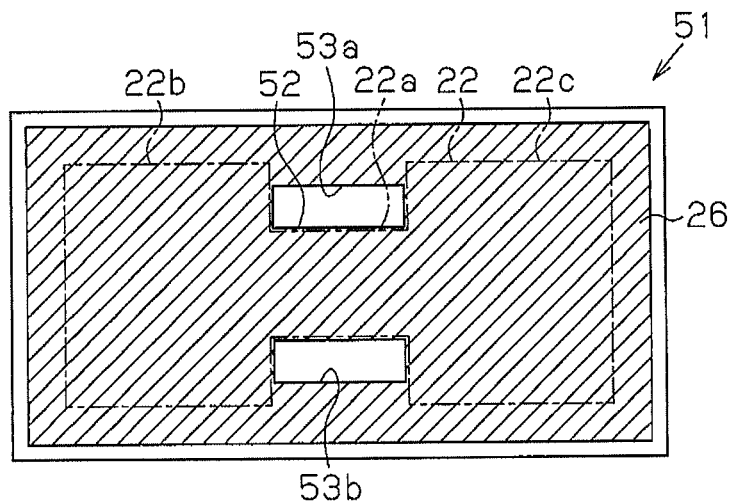
FIGS. 5A and 5B are plan views schematically illustrating other electric fuses.

The shape of the cover film may be changed appropriately. For example, as illustrated in FIG. 5A, an electric fuse 51 includes a conductive material 22 and a cover film 52. The cover film 52 covers all over the top surface of a wiring portion 22a of the conductive material 22. That is, the cover film 52 has substantially the same shape (size) as the wiring portion 22a. The cover film 52 may be formed of the same material (for example, silicon nitride film) as a protection film 26. In other words, the cover film 52 may also be referred to as a portion of the protection film 26. The cover film 52 has two end portions that are coupled, in the first direction, to the protection film 26 which covers the terminal portions 22b and 22c of the conductive material 22. That the cover film 52 is coupled to the protection film 26 means the cover film 52 and the protection film 26 are in the same layer and formed by using one pattern. Alternatively, a pattern of the cover film 52 and a pattern of the protection film 26 may be physically brought into contact with each other so that the cover film 52 and the protection film 26 are coupled to each other.

The cover film 52 and the protection film 26 may be formed with, for example, a silicon nitride film that covers all over the conductive material 22. The silicon nitride film includes openings 53a and 53b which expose side regions adjacent to the both sides of the wiring portion 22a. In other words, the openings 53a and 53b expose the regions which exist between the first and second terminal portion 22b and 22c and are free from the wiring portion 22a. The openings 53a and 53b each have a rectangle that extends in the first direction along the wiring portion 22a. The openings 53a and 53b may be formed by, for example, etching.

Since the end portions of the cover film 52 are both coupled to the protection film 26, the cover film 52 presses an entirety of the wiring portion 22a. Therefore, when the electric fuse 51 is being disconnected or broken, the wiring portion 22a, which is molten, moves in the second direction perpendicular to the first direction in which the wiring portion 22a extends, that is, toward the openings 53a and 53b. As a result, the wiring portion 22a is disconnected properly. Further, since the cover film 52 is coupled to the protection film 26, pressing force by the cover film 52 is larger than that by the cover film whose two end portions are not coupled to the protection film.

Accordingly, the molten wiring portion 22a is urged to move so that the wiring portion 22a may be disconnected securely.

Figure 5B:
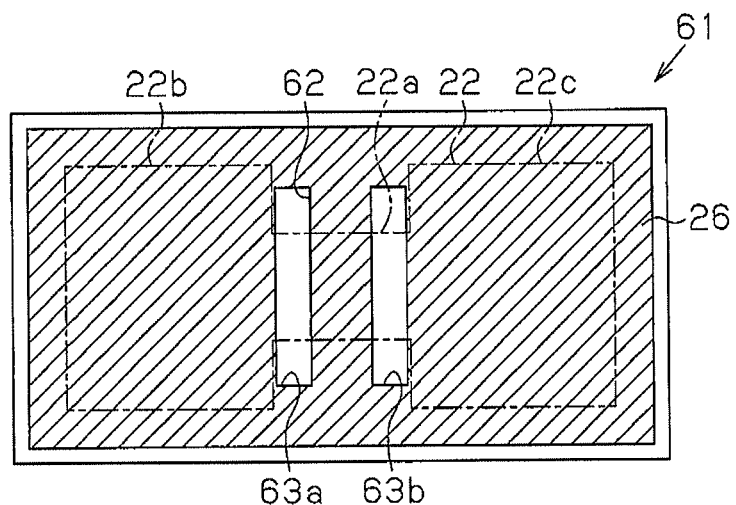

Further, as illustrated in FIG. 5B, an electric fuse 61 includes a conductive material 22 and a cover film 62. The cover film 62 covers a portion of a wiring portion 22a of the conductive material 22 and extends in the second direction perpendicular to the first direction in which the wiring portion 22a extends. The cover film 62 may be formed of the same material (for example, silicon nitride film) as a protection film 26. In other words, the cover film 62 may also be referred to as a portion of the protection film 26. The cover film 62 has two end portions that are coupled, in the second direction, to the protection film 26 which covers the terminal portions 22b and 22c of the conductive material 22.

The cover film 62 and the protection film 26 are formed with, for example, a silicon nitride film that covers all over the conductive material 22. The silicon nitride film includes openings 63a and 63b which expose the two end portions of the wiring portion 22a which are coupled to the terminal portions 22b and 22c respectively. The openings 63a and 63b extend in the second direction perpendicular to the first direction in which the wiring portion 22a extends. The openings 63a and 63b are each formed to have a larger width (length) than the width of the wiring portion 22a in the second direction. The openings 63a and 63b are, for example, rectangular. The openings 63a and 63b may be formed by, for example, etching.

Since the two end portions of the cover film 62 are both coupled to the protection film 26, pressing force by the cover film 62 is larger than that by the cover film whose two end portions are not coupled to the protection film. Accordingly, the wiring portion 22a, which is molten, is urged to move so that the wiring portion 22a may be disconnected securely. Further, the cover film 62 partially covers the wiring portion 22a and extends in the direction perpendicular to the direction in which the wiring portion 22a extends. Therefore, when the electric fuse 51 is being disconnected, the molten wiring portion 22a moves toward the end portions of the wiring portion 22a, that is, the openings 63a and 63b. As a result, the distance between ends of the disconnected portion becomes larger than a case where the cover film 62 is not formed. Accordingly, the wiring portion 22a is properly disconnected.

In FIGS. 5A and 5B, similarly to FIG. 1D, the conductive material 22 is illustrated by a dashed line in order to facilitate understanding of the positional relationships of the cover films 52 and 62 as well as the protection film 26 with respect to the conductive material 22. Further, to facilitate understanding of the positional relationships of the cover films 52 and 62 as well as the protection film 26 with respect to the wiring portion 22a, their respective end portions are shifted from each other.

In the structure illustrated in FIG. 5A, the cover film 52 may be formed in a manner such that the openings 53a and 53b are different in size. Similarly, in the structure illustrated in FIG. 5B, the cover film 62 may be formed in a manner such that the openings 63a and 63b are different in size.

In the structure illustrated in FIG. 5A, the two end portions of the cover film 52 are coupled to the protection film 26 in the first direction; however, either one of the two end portions of the cover film 52 in the second direction may be coupled to the protection film 26. Similarly, in the structure illustrated in FIG. 5B, the two end portions of the cover film 62 are coupled to the protection film 26 in the second direction; however, either one of the two end portions of the cover film 62 in the first direction may be coupled to the protection film 26.

In the structure illustrated in FIG. 1D, one, two, or three, of the four end portions (side ends) of the cover film 25 may be coupled to the protection film 26. That is, the cover film 25 may have end portions some of which are to be coupled to the protection film 26.

In the embodiment and the modified examples described above, the material of the conductive material 22 may be changed appropriately. For example, the conductive material 22 may be formed with a metal thin film resistor. The material of the metal thin film resistor may be, for example, aluminum (Al), molybdenum (Mo), or nickel chrome alloy (NiCr).

The invention claimed is:

1. An electric fuse comprising:
    a conductive material formed on a top surface of an insulating material, the conductive material including:
        a wiring portion, and
        first and second terminal portions arranged in two ends of the wiring portion so that the first terminal portion is connected to one end of the wiring portion and the second terminal portion is connected to the other end of the wiring portion, wherein the first terminal portion, the wiring portion, and the second terminal portion are lined up in a first direction, and the first and second terminal portions each have a width larger than a width of the wiring portion in a second direction perpendicular to the first direction;
    an insulating film covering the conductive material; a protection film having a tensile stress, the protection film being formed on the insulating film to cover the first terminal portion and the second terminal portion and to cover at least a part of the wiring portion; and
    an interlayer insulating film formed directly on a top surface of the protection film,
    wherein the protection film includes:
    an opening region which exposes a part of the insulating film above a region between the first terminal portion and the second terminal portion; and
    a cover film that differs from the interlayer insulating film, all portions of the cover film having a size that is equal to or smaller than a size of the opening region in the first direction as viewed from above such that the all portions of the cover film are formed within the opening region.

2. The electric fuse according to claim 1, wherein the opening region has a width larger than the width of the wiring portion in the second direction.

3. The electric fuse according to claim 1, wherein the opening region exposes a region which exists between the first terminal portion and the second terminal portion and which is free from the wiring portion.

4. The electric fuse according to claim 1, wherein the protection film comprises a silicon nitride film.

5. An electric fuse comprising:
    a conductive material formed on a top surface of an insulating material, the conductive material including:
        a wiring portion, and
        first and second terminal portions formed in two ends of the wiring portion so that the wiring portion is located between the first and second terminal portions in a first direction, wherein the first and second terminal portions each have a width larger than a width of the wiring portion in a second direction perpendicular to the first direction;
    an insulating film covering the conductive material;
    a cover film having a tensile stress, the cover film being formed on the insulating film to cover at least a part of the wiring portion;
    a protection film formed on the insulating film to cover the first terminal portion and the second terminal portion; and an interlayer insulating film formed directly on a top surface of the protection film, wherein the protection film includes an opening region to expose a part of the insulating film, the opening region having a size that corresponds to a rectangular region including the wiring portion, and wherein the cover film differs from the interlayer insulating film, all portions of the cover film having a size that is equal to or smaller than a size of the opening region in the first direction as viewed from above such that the all portions of the cover film are formed within the opening region.

6. The electric fuse according to claim 5, wherein the cover film comprises an end portion that is coupled to a part of the protection film.

7. The electric fuse according to claim 5, wherein the cover film is formed to have a same shape as the wiring portion to cover an entirety of a top surface of the wiring portion, and the cover film includes two end portions coupled to the protection film in the first direction.

8. The electric fuse according to claim 5, wherein the cover film is formed to cover the part of the wiring portion, and the cover film includes two end portions coupled to the protection film in the second direction.

9. The electric fuse according to claim 5, wherein the cover film comprises a silicon nitride film.

10. The electric fuse according to claim 5, wherein the protection film comprises a silicon nitride film.

11. The electric fuse according to claim 5, wherein the cover film and the protection film are one pattern integrally formed.

12. An electric fuse comprising:
a conductive material formed on a top surface of an insulating material, the conductive material including:
  a wiring portion, and
  first and second terminal portions arranged in two ends of the wiring portion so that the first terminal portion is connected to one end of the wiring portion and the second terminal portion is connected to the other end of the wiring portion, wherein the first terminal portion, the wiring portion, and the second terminal portion are lined up in a first direction, and the first and second terminal portions each have a width larger than a width of the wiring portion in a second direction perpendicular to the first direction;
an insulating film covering the conductive material;
a protection film having a tensile stress, the protection film being formed on the insulating film to cover the first terminal portion and the second terminal portion and to cover at least a part of the wiring portion; and
an interlayer insulating film formed directly on a top surface of the protection film, wherein the protection film includes:
a first opening region and a second opening region, each of the first opening region and the second opening region exposing a part of the insulating film above a region which exists between the first terminal portion and the second terminal portion and which is free from the wiring portion; and
a cover film that differs from the interlayer insulating film, all portions of the cover film being formed in a region sandwiched between the first opening region and the second opening region.

13. An electric fuse comprising:
a conductive material formed on a top surface of an insulating material, the conductive material including:
  a wiring portion, and
  first and second terminal portions arranged in two ends of the wiring portion so that the first terminal portion is connected to one end of the wiring portion and the second terminal portion is connected to the other end of the wiring portion, wherein the first terminal portion, the wiring portion, and the second terminal portion are lined up in a first direction, and the first and second terminal portions each have a width larger than a width of the wiring portion in a second direction perpendicular to the first direction;
an insulating film covering the conductive material;
a protection film having a tensile stress, the protection film being formed on the insulating film to cover the first terminal portion and the second terminal portion and to cover at least a part of the wiring portion; and
an interlayer insulating film formed directly on a top surface of the protection film, wherein the protection film includes:
a third opening region and a fourth opening region that are separate from each other and extend in the second direction, each of the third opening region and the fourth opening region exposing a part of the insulating film above a region which exists between the first terminal portion and the second terminal portion, the region including a first area which is free from the wiring portion and a second area in which the wiring portion exists; and
a cover film that differs from the interlayer insulating film, all portions of the cover film being formed in a region sandwiched between the third opening region and the fourth opening region.

14. The electric fuse according to claim 12, wherein the protection film includes a third opening region and a fourth opening region that are separate from each other and located above the wiring portion.

15. The electric fuse according to claim 14, wherein:
the first opening region is in communication with the third opening region and the fourth opening region; and
the second opening region is in communication with the third opening region and the fourth opening region.

* * * * *